United States Patent
Agarwal et al.

(10) Patent No.: US 8,464,194 B1
(45) Date of Patent: Jun. 11, 2013

(54) MACHINE LEARNING APPROACH TO CORRECT LITHOGRAPHIC HOT-SPOTS

(75) Inventors: Kanak Behari Agarwal, Austin, TX (US); Shayak Banerjee, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/328,994

(22) Filed: Dec. 16, 2011

(51) Int. Cl.
*G06F 17/50* (2006.01)

(52) U.S. Cl.
USPC ............................. 716/112; 716/52; 716/139

(58) Field of Classification Search
USPC ........................................... 716/52, 112, 139
See application file for complete search history.

(56) References Cited

U.S. PATENT DOCUMENTS

| | | | | |
|---|---|---|---|---|
| 5,475,607 A * | 12/1995 | Apte et al. | ...................... | 716/113 |
| 5,796,621 A * | 8/1998 | Dudley et al. | .................. | 716/103 |
| 5,841,673 A * | 11/1998 | Kobayashi et al. | ........... | 716/108 |
| 6,412,096 B1 * | 6/2002 | Ventrone | ........................ | 716/108 |
| 6,477,688 B1 * | 11/2002 | Wallace | .......................... | 716/107 |
| 6,584,609 B1 * | 6/2003 | Pierrat et al. | ..................... | 716/52 |
| 6,671,866 B2 * | 12/2003 | Arsintescu | ..................... | 716/124 |
| 6,687,887 B1 * | 2/2004 | Teig et al. | ...................... | 716/115 |
| 6,836,753 B1 * | 12/2004 | Silve | ................................ | 703/2 |
| 6,948,138 B1 * | 9/2005 | Shen | ................................ | 716/114 |
| 7,047,163 B1 * | 5/2006 | Chakraborty et al. | ............ | 703/2 |
| 7,047,169 B2 * | 5/2006 | Pelikan et al. | ..................... | 703/2 |
| 7,065,423 B2 * | 6/2006 | Prager et al. | ................... | 700/108 |
| 7,487,486 B2 * | 2/2009 | Celik et al. | ..................... | 716/134 |
| 7,512,508 B2 * | 3/2009 | Rajski et al. | .................. | 702/118 |
| 7,558,419 B1 * | 7/2009 | Ye et al. | ........................ | 382/144 |
| 7,624,364 B2 * | 11/2009 | Albrecht et al. | ............... | 716/113 |
| 7,801,901 B2 * | 9/2010 | Surendran | ...................... | 707/748 |
| 7,882,461 B2 * | 2/2011 | Jiang et al. | ..................... | 716/132 |
| 7,894,927 B2 * | 2/2011 | Funk et al. | ..................... | 700/121 |
| 8,001,512 B1 * | 8/2011 | White | ............................ | 716/119 |
| 8,117,568 B2 * | 2/2012 | Xiang et al. | ................... | 716/100 |
| 8,136,068 B2 * | 3/2012 | Song et al. | ..................... | 716/110 |
| 8,195,435 B2 * | 6/2012 | Bischoff | ............................ | 703/2 |
| 2004/0267397 A1 * | 12/2004 | Doddi et al. | ................... | 700/110 |
| 2008/0077907 A1 * | 3/2008 | Kulkami | ........................... | 716/20 |
| 2009/0158116 A1 * | 6/2009 | Kim | ............................. | 714/752 |
| 2009/0254874 A1 * | 10/2009 | Bose | ................................ | 716/6 |

(Continued)

OTHER PUBLICATIONS

Ding et al. "High Performance Lithographic Hotspot Detection using Hierarchically Refined Machine Learning"; Asia and South Pacific Design Automation Conference (ASPDAC); Jan. 25-28, 2011; pp. 775-780.*

*Primary Examiner* — Naum Levin
(74) *Attorney, Agent, or Firm* — Garg Law Firm, PLLC; Rakesh Garg; Eustus D. Nelson

(57) ABSTRACT

A method, system, and computer program product for machine learning approach for detecting and correcting lithographic hot-spots in an integrated circuit (IC) design are provided in the illustrative embodiments. A layout corresponding to the IC design is received at a machine learning model (ML model). At the ML model using a hardware component, a set of input objects is identified corresponding to a target shape in the layout. A retargeting value is predicted for the target shape using the set of input objects, such that applying the retargeting value to the target shape in the layout causes the target shape to be modified into a modified target shape, wherein printing the modified target shape instead of the target shape eliminates a lithographic hot-spot that would otherwise occur from printing the target shape in a printed circuit corresponding to the IC design.

20 Claims, 5 Drawing Sheets

U.S. PATENT DOCUMENTS

2010/0077372 A1* 3/2010 Xiang et al. ............... 716/12
2010/0083200 A1* 4/2010 Song et al. ................ 716/5
2010/0324878 A1* 12/2010 Lee et al. ................. 703/14
2011/0252389 A1* 10/2011 Albrecht et al. ........... 716/108
2012/0030643 A1* 2/2012 Hurley et al. ............. 716/136

* cited by examiner

FIG. 3

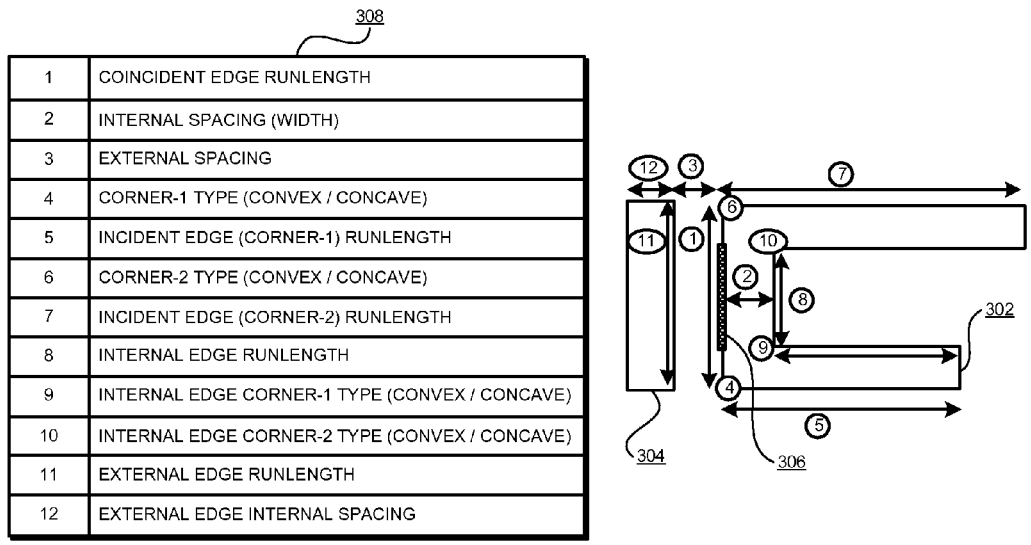

| 1 | COINCIDENT EDGE RUNLENGTH |
| 2 | INTERNAL SPACING (WIDTH) |
| 3 | EXTERNAL SPACING |
| 4 | CORNER-1 TYPE (CONVEX / CONCAVE) |
| 5 | INCIDENT EDGE (CORNER-1) RUNLENGTH |
| 6 | CORNER-2 TYPE (CONVEX / CONCAVE) |
| 7 | INCIDENT EDGE (CORNER-2) RUNLENGTH |
| 8 | INTERNAL EDGE RUNLENGTH |
| 9 | INTERNAL EDGE CORNER-1 TYPE (CONVEX / CONCAVE) |
| 10 | INTERNAL EDGE CORNER-2 TYPE (CONVEX / CONCAVE) |
| 11 | EXTERNAL EDGE RUNLENGTH |
| 12 | EXTERNAL EDGE INTERNAL SPACING |

FIG. 4

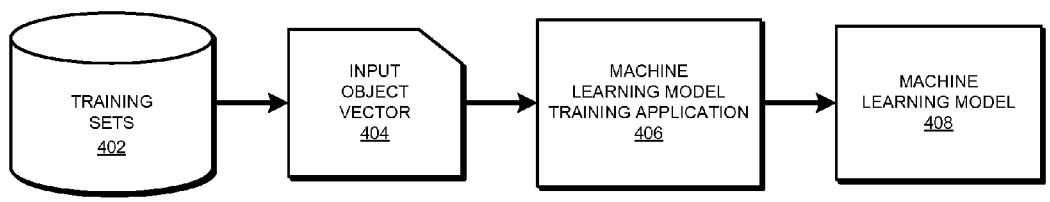

MACHINE LEARNING APPROACH TO CORRECT LITHOGRAPHIC HOT-SPOTS

TECHNICAL FIELD

The present invention relates generally to a computer implemented method, system, and computer program product for improving an integrated circuit (IC) design. Particularly, the present invention relates to a computer implemented method, system, and computer program product for a machine learning approach to correct lithographic hot-spots (hot-spots, singular hot-spot).

BACKGROUND

Description of the Related Art

Modern day electronics include components that use integrated circuits. Integrated circuits are electronic circuits formed using Silicon as a substrate and by adding impurities to form solid-state electronic devices, such as transistors, diodes, and resistors. Commonly known as a "chip", an integrated circuit is generally encased in hard plastic, forming a "package".

The software tools used for designing ICs produce, manipulate, or otherwise work with the circuit layout and circuit components on very small scales. Some of the components that such a tool may manipulate may only measure tens of nanometer across when formed in Silicon. The designs produced and manipulated using these software tools are complex, often including hundreds of thousands of such components interconnected to form an intended electronic circuitry.

A wire is a connection between parts of electronic components, and is formed using a metallic material that conducts electricity. An IC may contain many layers of metal interconnects to implement a circuit. Metal interconnects in different layers are isolated from each other with inter layer dielectric. The metal layers can be connected by creating vias in the dielectric.

In an IC design process, design components such as transistors are placed and interconnected to determine the resulting circuit's characteristics. Components can be moved or changed if certain characteristics have to be altered. The design layout is constructed using different design layers (e.g. polysilicon, metal-1, metal-2, etc.) as specified by the technology. The technology specifications also provide a set of design rules that represent the manufacturing capability of the process. These technology ground rules or design rules should be followed during layout design to create a manufacturable design.

Once a design layout, also referred to simply as a layout, has been finalized for an IC, the design is converted into a set of masks or reticles. During manufacture, a semiconductor wafer is exposed to light or radiation through a mask to form microscopic components of the IC. This process is known as photolithography.

A manufacturing mask is a mask usable for successfully manufacturing or printing the contents of the mask onto wafer. During the printing process, radiation is focused through the mask and at certain desired intensity of the radiation. This intensity of the radiation is commonly referred to as "dose". The focus and the dosing of the radiation have to be precisely controlled to achieve the desired shape and electrical characteristics on the wafer.

SUMMARY

The illustrative embodiments provide a method, system, and computer program product for machine learning approach to correct lithographic hot-spots. An embodiment receives, at a machine learning model (ML model) a layout corresponding to the IC design. The embodiment identifies, at the ML model using a hardware component, a set of input objects corresponding to a target shape in the layout. The embodiment predicts a retargeting value for the target shape using the set of input objects, such that applying the retargeting value to the target shape in the layout causes the target shape to be modified into a modified target shape, wherein printing the modified target shape instead of the target shape eliminates a lithographic hot-spot that would otherwise occur from printing the target shape in a printed circuit corresponding to the IC design.

BRIEF DESCRIPTION OF THE SEVERAL VIEWS OF THE DRAWINGS

The novel features believed characteristic of the embodiments are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 3 depicts an example target layout within which a hot-spot can be detected and remedied using an ML model in accordance with an illustrative embodiment;

FIG. 4 depicts a block diagram of training an ML model for detecting and correcting lithographic hot spots in accordance with an illustrative embodiment;

DETAILED DESCRIPTION

Figure 1:
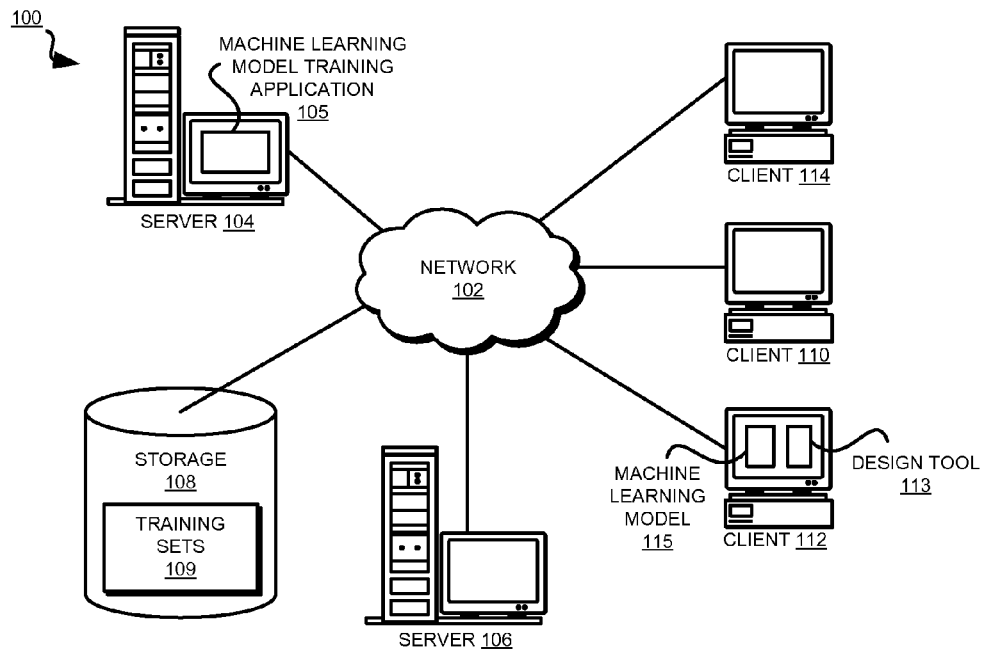
FIG. 1 depicts a pictorial representation of a network of data processing systems in which illustrative embodiments may be implemented.

A layout includes shapes that the designer selects and positions to achieve a design objective. Through a process known as optical proximity correction (OPC), the shapes are transformed in a mask to correct for optical and other manufacturing related idiosyncrasies. This is generally done by counterbiasing the mask at each of a number of segments along the edges of the mask shapes. These segments are also known as fragments.

For example, a designer may place a geometric shape in a layout that, if formed on wafer using photolithography (lithography), would cause a constricted or pinched area to be printed on the wafer. Such shape variations during lithography, including but not limited to pinching, are called lithographic hot-spots.

A goal of OPC is to find a mask that when exposed during lithography, achieves good pattern fidelity of drawn target (layout) shape and on-wafer printed image. For example, when printing a rectangular target, the printed wafer contour may show significantly rounded corners. The mask optimization flow in OPC tries to compensate for this rounding and other mismatches between the target and the printed image by finding a mask that minimizes the difference between target and printed image. OPC starts with an initial mask, fragments the mask into segments, performs lithographic simulation, looks at the printed contour for the mask to calculate the edge placement errors between printed wafer contour and the drawn target, and moves different mask fragments to compensate for these edge placement errors. This process is repeated iteratively until the edge placement errors are within a specified limit. Presently, OPC can be configured to modify a mask such that certain known hot-spots can be remedied before manufacturing.

In deep subwavelength lithography, OPC may not be sufficient for correcting all lithographic hot-spots. For certain hot-spots, the target itself has to be reconfigured using a process called retargeting. Retargeting changes the shape, dimensions, positioning, or a combination thereof of a target to result in a modified target. The modified target when converted to a mask through mask optimization techniques such as OPC has better printability than the original target.

Presently available methods accomplish retargeting in one of two following ways. A first method employs a set of retargeting rules for retargeting. A retargeting rule is configured to detect a target satisfying a pre-defined hot-spot condition, and apply a pre-determined correction (a retargeting value) to the target to result in a modified target, which no longer satisfies the pre-defined hot-spot condition.

As an example, a retargeting rule may be that if a metal-1 (M1) target has a specified pitch and width (the pre-defined hot-spot condition), bias the metal shapes by x nanometers (nm) (the correction or retargeting value). As another example, another retargeting rule may be that if a notch is less than or equal to y nm (the pre-defined hot-spot condition), fill the notch by z nm (the correction or retargeting value).

The illustrative embodiments recognize that a rules based retargeting method is limited in several ways. For example, a retargeting rules library includes a limited set of rules, and cannot include rules for all possible hot-spot conditions. For example, just for testing three factors with three example possible value ranges for detecting a hot-spot condition, such as an edge's run-length, an adjacent edge's run-length, and an external spacing between the two edges, $3^3$ rules (twenty seven rules) have to be created, evaluated, and applied to each candidate target. (Generally, for other possible value ranges (buckets), $n1*n2*n3$ rules are required, where n1 is the # of buckets for factor 1, n2 is the # of buckets for factor 2, and n3 is the # of buckets for factor 3.) With just one additional factor, such as an internal spacing of the first edge, the number of rules grows exponentially in a similar manner. A factor, or a hot-spot factor, is a characteristic of a target in a layout, the characteristic contributing to a hot-spot involving the target.

The illustrative embodiments recognize that creating, evaluating, and applying a large set of rules to potentially tens of thousands, even millions, of target shapes in a typical design layout can be computationally intensive. Thus, the illustrative embodiments recognize that rules based retargeting is necessarily simplistic, considering far fewer factors than the potential number of factors that can contribute to hot-spots in a layout.

The illustrative embodiments further recognize that the retargeting rules can be created only for hot-spot conditions that have been previously observed. Retargeting using a rule based method is not usable for detecting yet unseen hot-spot condition that may arise due to a particular combination of particular values of several factors for a target in a given layout.

Another presently used method is a lithographic simulation based hot-spot correction. Such a method requires a full lithographic simulation to detect hot-spots in a given design. The targets including the detected hot-spots can then be modified using suitable retargeting values.

The illustrative embodiments recognize that simulation based retargeting greatly increases runtime complexity of the mask synthesis process. If retargeting is integrated with OPC, OPC has to modify the target as well as find optimized mask for the modified target. Thus, the illustrative embodiments recognize that performing retargeting in OPC, while allows detection and correction of a variety of hot-spots in a given layout, causes the OPC process to become computationally expensive.

The illustrative embodiments further recognize that simulation based retargeting at OPC does not involve the designer, and therefore is not able to account for timing, power, and other design constraints that the designer considers while creating the design rule clean layout. Therefore, simulation based retargeting at OPC has to be limited in scope to avoid violating a design constraint.

Some other methods provide other techniques for detecting the hot-spots. Such techniques, however, leave the remedy for the detected hot-spots to the designer. If a hot-spot is detected but no corrective information is provided, the correction process has to fall back to manual intervention by the designer.

The illustrative embodiments used to describe the invention generally address and solve the above-described problems and other problems related to hot-spot detection and correction. The illustrative embodiments provide a method, system, and computer program product for machine learning approach to correct lithographic hot-spots. An embodiment offers an improved manner of detecting and correcting hot-spot conditions in a given layout. An embodiment uses a machine learning model, such as based on an artificial neural network (ANN), a support vector machine (SVM), or another machine learning methodology, to learn the hot-spot detection and correction considerations from a library of training sets.

A training set is a collection of layouts with known hot-spots conditions, factors causing those hot-spots, and desired retargeting values for correcting those hot-spots. A machine learning model (ML model) is hardware or software, configured to use the factors and produce those desired retargeting values for those hot-spot conditions in the training set.

An ML model according to an embodiment is trained using several training sets. The resulting trained ML model is a model that, when provided with a new layout, can use a combination of the learned factors to detect hot-spot conditions in the layout and predict corresponding retargeting values.

An embodiment adds the layout, the detected hot-spots, and the set of known desired retargeting values, to the training sets as a new training set. Over time, with an increasing collection of training sets, the ML model can be trained/retrained with more and more training sets. Training with increasing number and variety of training sets improves the accuracy of the ML model of an embodiment. For example, a retrained ML model can detect hot-spots with greater accuracy as compared to a lesser trained ML model, predict retargeting values with greater accuracy, and detect hot-spots not included in a training set but based on the training set factors.

The embodiments are described using a particular set of factors only for the clarity of the description and not as a limitation on the illustrative embodiments. In a typical design, the ML model according to an embodiment is usable with a combination of any number of factors within the scope of the illustrative embodiments.

The illustrative embodiments are described with respect to certain design shapes and targets only as examples. Such descriptions are not intended to be limiting on the illustrative embodiments. For example, an illustrative embodiment described with respect to edges in layout can be implemented with respect to corner types, e.g., convex, concave, internal or external spacing between edges, and many other similar features in the design within the scope of the illustrative embodiments.

Similarly, the illustrative embodiments are described with respect to a certain ML model, such as ANN or SVM, only as examples. Such descriptions are not intended to be limiting on the illustrative embodiments.

Furthermore, the illustrative embodiments may be implemented with respect to any type of data, data source, or access to a data source over a data network. Any type of data storage device may provide the data to an embodiment of the invention, either locally at a data processing system or over a data network, within the scope of the invention.

The illustrative embodiments are further described with respect to certain applications only as examples. Such descriptions are not intended to be limiting on the invention. An embodiment of the invention may be implemented with respect to any type of application, such as, for example, applications that are served, the instances of any type of server application, a platform application, a stand-alone application, an administration application, or a combination thereof.

An application, including an application implementing all or part of an embodiment, may further include data objects, code objects, encapsulated instructions, application fragments, services, and other types of resources available in a data processing environment. For example, a Java® object, an Enterprise Java Bean (EJB), a servlet, or an applet may be manifestations of an application with respect to which the invention may be implemented. (Java and all Java-based trademarks and logos are trademarks or registered trademarks of Oracle and/or its affiliates).

An illustrative embodiment may be implemented in hardware, software, or a combination thereof. An illustrative embodiment may further be implemented with respect to any type of computing resource, such as a physical or virtual data processing system or components thereof, that may be available in a given computing environment.

The illustrative embodiments are described using specific code, designs, architectures, layouts, schematics, and tools only as examples and are not limiting on the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures.

The examples in this disclosure are used only for the clarity of the description and are not limiting on the illustrative embodiments. Additional data, operations, actions, tasks, activities, and manipulations will be conceivable from this disclosure and the same are contemplated within the scope of the illustrative embodiments.

Any advantages listed herein are only examples and are not intended to be limiting on the illustrative embodiments. Additional or different advantages may be realized by specific illustrative embodiments. Furthermore, a particular illustrative embodiment may have some, all, or none of the advantages listed above.

Figure 2:
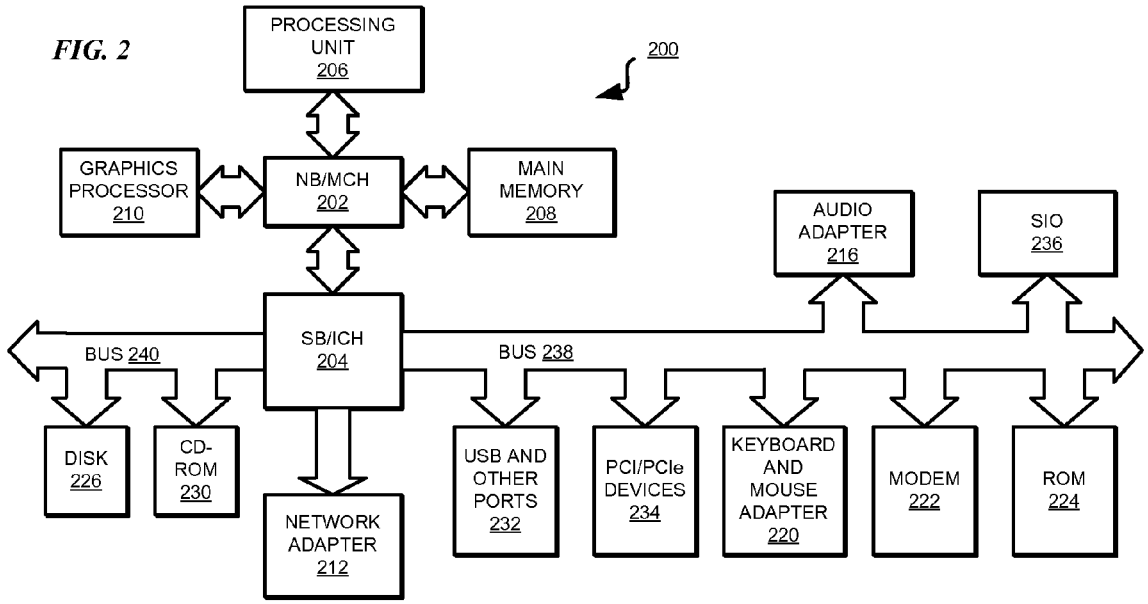
FIG. 2 depicts a block diagram of a data processing system in which illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a pictorial representation of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables. Server 104 and server 106 couple to network 102 along with storage unit 108. Software applications may execute on any computer in data processing environment 100.

In addition, clients 110, 112, and 114 couple to network 102. A data processing system, such as server 104 or 106, or client 110, 112, or 114 may contain data and may have software applications or software tools executing thereon.

A data processing system, such as server 104 may include machine learning model training application 105. Application 105 is usable for training an ML model according to an embodiment. A data processing system, such as client 112, may include design tool 113 executing thereon. Design tool 113 may include a presently available shape processing tool, and may be modified according to an embodiment. Machine learning model 115 is an ML model according to an embodiment. ML model 115 can be implemented in hardware, software, or a combination thereof. Application 105 uses training sets 109 to train ML model 115. ML model 115 may execute in conjunction with design tool 113 on client 112 or a different data processing system. In one embodiment, ML model 115 is a part of design tool 113. In another embodiment, ML model 115 is a separate application operating in conjunction with design tool 113 on client 112 or a different data processing system.

Servers 104 and 106, storage unit 108, and clients 110, 112, and 114 may couple to network 102 using wired connections, wireless communication protocols, or other suitable data connectivity. Clients 110, 112, and 114 may be, for example, personal computers or network computers.

In the depicted example, server 104 may provide data, such as boot files, operating system images, and applications to clients 110, 112, and 114. Clients 110, 112, and 114 may be clients to server 104 in this example. Clients 110, 112, 114, or some combination thereof, may include their own data, boot files, operating system images, and applications. Data processing environment 100 may include additional servers, clients, and other devices that are not shown.

In the depicted example, data processing environment 100 may be the Internet. Network 102 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 100 also may be implemented as a number of different types of networks, such as for example, an intranet, a local area network (LAN), or a wide area network (WAN). FIG. 1 is intended as an example, and not as an architectural limitation for the different illustrative embodiments.

Among other uses, data processing environment 100 may be used for implementing a client-server environment in which the illustrative embodiments may be implemented. A client-server environment enables software applications and data to be distributed across a network such that an application functions by using the interactivity between a client data processing system and a server data processing system. Data processing environment 100 may also employ a service oriented architecture where interoperable software components distributed across a network may be packaged together as coherent business applications.

With reference to FIG. 2, this figure depicts a block diagram of a data processing system in which illustrative embodiments may be implemented. Data processing system 200 is an example of a computer, such as server 104 or client 110 in FIG. 1, in which computer usable program code or instructions implementing the processes of the illustrative embodiments may be located for the illustrative embodiments.

In the depicted example, data processing system 200 employs a hub architecture including North Bridge and memory controller hub (NB/MCH) 202 and south bridge and input/output (I/O) controller hub (SB/ICH) 204. Processing unit 206, main memory 208, and graphics processor 210 are coupled to north bridge and memory controller hub (NB/MCH) 202. Processing unit 206 may contain one or more processors and may be implemented using one or more heterogeneous processor systems. Graphics processor 210 may be coupled to the NB/MCH through an accelerated graphics port (AGP) in certain implementations.

In the depicted example, local area network (LAN) adapter 212 is coupled to south bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to south bridge and I/O controller hub 204 through bus 238. Hard disk drive (HDD) 226 and CD-ROM 230 are coupled to south bridge and I/O controller hub 204 through bus 240. PCI/PCIe devices may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE) or serial advanced technology attachment (SATA) interface. A super I/O (SIO) device 236 may be coupled to south bridge and I/O controller hub (SB/ICH) 204.

An operating system runs on processing unit 206. The operating system coordinates and provides control of various components within data processing system 200 in FIG. 2. The operating system may be a commercially available operating system such as Microsoft® Windows® (Microsoft and Windows are trademarks of Microsoft Corporation in the United States, other countries, or both), or Linux® (Linux is a trademark of Linus Torvalds in the United States, other countries, or both). An object oriented programming system, such as the Java™ programming system, may run in conjunction with the operating system and provides calls to the operating system from Java™ programs or applications executing on data processing system 200 (Java and all Java-based trademarks and logos are trademarks or registered trademarks of Oracle and/or its affiliates).

Program instructions for the operating system, the object-oriented programming system, the processes of the illustrative embodiments, and applications or programs are located on storage devices, such as hard disk drive 226, and may be loaded into a memory, such as, for example, main memory 208, read only memory 224, or one or more peripheral devices, for execution by processing unit 206. Program instructions may also be stored permanently in non-volatile memory and either loaded from there or executed in place. For example, the synthesized program according to an embodiment can be stored in non-volatile memory and loaded from there into DRAM.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different components or devices attached to the fabric or architecture.

A communications unit may include one or more devices used to transmit and receive data, such as a modem or a network adapter. A memory may be, for example, main memory 208 or a cache, such as the cache found in north bridge and memory controller hub 202. A processing unit may include one or more processors or CPUs.

The depicted examples in FIGS. 1-2 and above-described examples are not meant to imply architectural limitations. For example, data processing system 200 also may be a tablet computer, laptop computer, or telephone device in addition to taking the form of a PDA.

With reference to FIG. 3, this figure depicts an example target layout within which a hot-spot can be detected and remedied using an ML model in accordance with an illustrative embodiment. Shapes 302 and 304 may be example shapes present in an example design layout and available to a shape processing tool, such as a shape processing tool in design tool 113 in FIG. 1.

Shapes 302 and 304 together form a target that includes edge fragment 306 for which a set of factors are defined, as illustrated in table 308. Similarly, these or different combinations of factors can be considered for other edge fragments or layout artifacts. Table 308 lists twelve example factors that can contribute to or are otherwise associated with edge fragment 306, as indicated by corresponding numeric labels.

A factor, such as a factor in table 308, is also known as an input object. As an example, in one embodiment, an input object is calculated as follows—for a given target shape, a shape processing operation segments different edges of the target shape into edge segments. The embodiment then calculates the input object for an edge segment by computing distances between the edge segment and another edge segment, another edge, another shape, or a combination thereof, that is in a defined neighborhood (within a defined proximity) of the edge segment. Several distances from various neighborhood edges or shapes forms the input object set for that edge segment. A set of factors, such as factors 1-12 in FIG. 3, can be a part of a training set provided to an ML model training application, such as ML model training application 105 in FIG. 1, or to an ML model, such as ML model 115 in FIG. 1.

Any combination of the twelve example factors in table 308 could contribute to retargeting of edge fragment 306. An ML model according to an embodiment can be trained to consider a large set of factors, such as in table 308 to predict retargeting values, without the limited flexibility of a rule based retargeting method or the computational expense of a simulation based retargeting method. As an example, in a rule based retargeting method, if ten example factors were to be considered for predicting retargeting values using twelve example value ranges for each factor, $12^{10}$ rules (sixty one billion nine hundred and seventeen million three hundred sixty four thousand two hundred and twenty four rules) would have to be created and evaluated to predict retargeting values.

With reference to FIG. 4, this figure depicts a block diagram of training an ML model for detecting and correcting lithographic hot spots in accordance with an illustrative embodiment. Training sets 109 in FIG. 1 can be used as training sets 402.

In one embodiment, input object vector 404 can include some or all of the factors in table 308 in FIG. 3. ML model training application 105 in FIG. 1 can be used as ML model training application 406. ML model 408 can be used as ML model 115 in FIG. 1.

Training sets 402 include one or more training set of training layout, training factors, training hot spots, and desired retargeting values. Of course, an implementation may include other information in training sets 402 as well, without digressing from the scope of the illustrative embodiments. Input object vector 404 is formed using the training factors that serve as input to the model. Desired retargeting values are the desired output from the model. The model training process builds a model that predicts the desired retargeting values as output for the given set of values of input object vector 404. The desired retargeting values are applied to the target shape, target shape's edge or edge segment based on which input object vector 404 was constructed. Because a hot-spot is a lithographic anomaly at a location in a layout where a variation between a printed shape and a corresponding drawn target shape exceeds a threshold, the retargeting of an edge segment of the target shape modifies the target shape, where printing the modified target shape removes the possibility of the hot-spot when the layout is printed.

ML model training application 406 produces ML model 408 using input object vector 404 and the desired retargeting values. When executed, as in FIG. 5, ML model 408 can detect hot-spots in new layouts using input factors included in the set of training factors, and produce retargeting values commensurate with the desired retargeting values during the training.

Figure 5:
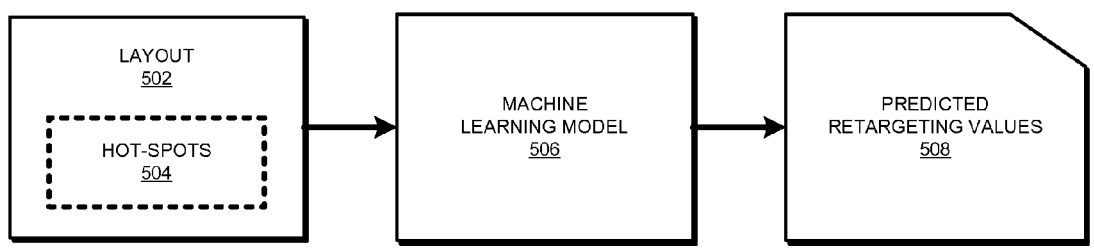
FIG. 5 depicts a block diagram of an ML model configured to detect and correct lithographic hot-spots in accordance with an illustrative embodiment.

With reference to FIG. 5, this figure depicts a block diagram of an ML model configured to detect and correct lithographic hot-spots in accordance with an illustrative embodiment. Layout 502 may be a layout that has to be printed using photolithography. Layout 502 includes a set of one or more hot-spots 504 that have to be detected and remedied. ML model 408 in FIG. 4 can be used as ML model 506.

ML model 506 receives as input layout 502. Based on the configuration within ML model 506, which was formed using training sets 402 and corresponding input object vector 404 in FIG. 4, ML model 506 outputs predicted retargeting values 508. Predicted retargeting values 508 identifies hot-spots 504 and provides suggested (predicted) retargeting values 508 to avoid them.

Normally training sets 512 include known patterns with known retargeting values, which are characterized through full litho simulation. The known patterns can be known hot-spots, some canonical patterns such as width/space combinations, or some other patterns generated through sampling of input features. An embodiment increases training sets 512 with an addition training set with new retargeting values for new sets of input objects that may be computed using lithographic simulations. Increased training sets 512 can be used to retrain ML model 506, to improve model 506's accuracy for future layouts.

Figure 6:
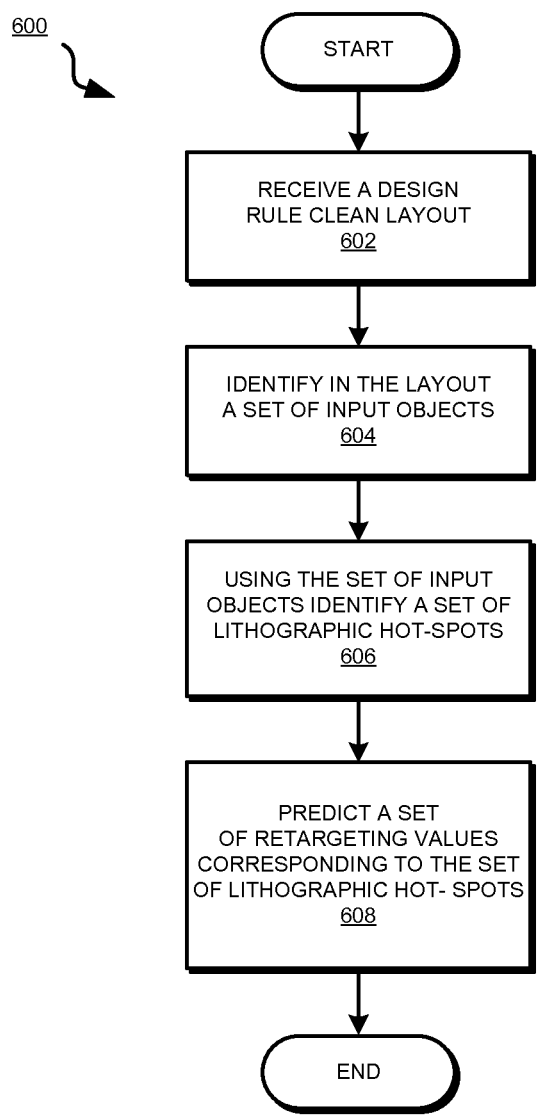
FIG. 6 depicts a flowchart of a process of using a machine learning approach to detect and correct lithographic hot-spots in accordance with an illustrative embodiment.

With reference to FIG. 6, this figure depicts a flowchart of a process of using a machine learning approach to detect and correct lithographic hot-spots in accordance with an illustrative embodiment. Process 600 can be implemented in an ML model, such as ML model 506 in FIG. 5.

Process 600 begins by receiving a design rule clean layout, such as layout 502 in FIG. 5 (step 602). Process 600 identifies in the layout, a set of input objects, such as input object vector 404 in FIG. 4 (step 604). For example, at step 604, an embodiment can perform fragmentation of the layout edges and then compute the values of input factors for each fragment.

Process 600 identifies a set of lithographic hot-spots in the layout using the set of input objects (step 606). Process 600 predicts a set of retargeting values corresponding to the set of hot-spots detected in step 606 (step 608). Process 600 ends thereafter.

Figure 7:
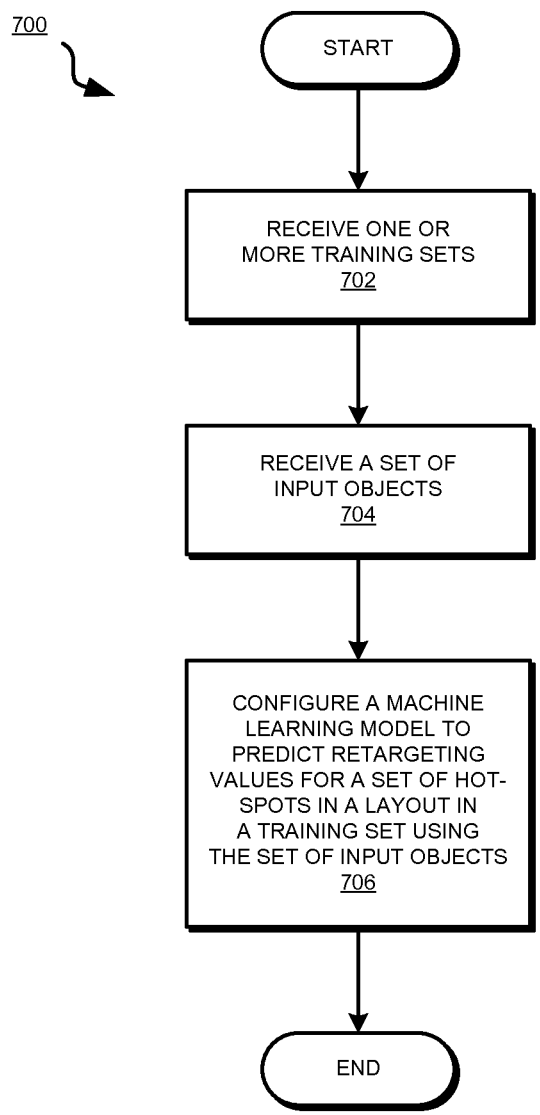
FIG. 7 depicts a flowchart of a process for training an ML model for detecting and correcting lithographic hot-spots in IC design layouts in accordance with an illustrative embodiment.

With reference to FIG. 7, this figure depicts a flowchart of a process for training an ML model for detecting and correcting lithographic hot-spots in IC design layouts in accordance with an illustrative embodiment. Process 700 can be implemented in an ML model training application, such as ML model training application 406 in FIG. 4.

Process 700 begins by receiving one or more training sets, such as training sets 402 in FIG. 4 (step 702). Process 700 receives a set of input objects, such as input objects 404 in FIG. 4 (step 704). The set of input objects of step 704 can be constructed from the collection of training sets of step 702 in the example manner described earlier.

Process 700 configures an ML model to predict retargeting values for a set of hot-spots in a layout, by using known hot-spots and known corresponding retargeting values from the training sets (step 706). Process 700 ends thereafter.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Thus, a computer implemented method, system, and computer program product are provided in the illustrative embodiments for using a machine learning approach to detect and correct lithographic hot-spots in an IC design layout.

Using an embodiment of the invention, lithographic hot-spots resulting from a combination of factors can be detected. An embodiment allows such detection with a much larger collection of factors while keeping the computational cost of the detection similar to the computational cost of a rule based detection method using significantly fewer factors. Furthermore, an embodiment also detects hot-spots that are not previously known in the training sets for the ML model of the embodiment.

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable storage device(s) or computer readable media having computer readable program code embodied thereon.

Any combination of one or more computer readable storage device(s) or computer readable media may be utilized. The computer readable medium may be a computer readable signal medium or a computer readable storage medium. A computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible device or medium that can contain, or store a program for use by or in connection with an instruction execution system, apparatus, or device.

Program code embodied on a computer readable storage device or computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to one or more processors of one or more general purpose computers, special purpose computers, or other programmable data processing apparatuses to produce a machine, such that the instructions, which execute via the one or more processors of the computers or other programmable data processing apparatuses, create means for implementing the functions/acts specified in the flowchart and/or block diagram block or blocks.

These computer program instructions may also be stored in one or more computer readable storage devices or computer readable that can direct one or more computers, one or more other programmable data processing apparatuses, or one or more other devices to function in a particular manner, such that the instructions stored in the one or more computer readable storage devices or computer readable medium produce an article of manufacture including instructions which implement the function/act specified in the flowchart and/or block diagram block or blocks.

The computer program instructions may also be loaded onto one or more computers, one or more other programmable data processing apparatuses, or one or more other devices to cause a series of operational steps to be performed on the one or more computers, one or more other programmable data processing apparatuses, or one or more other devices to produce a computer implemented process such that the instructions which execute on the one or more computers, one or more other programmable data processing apparatuses, or one or more other devices provide processes for implementing the functions/acts specified in the flowchart and/or block diagram block or blocks.

The terminology used herein is for the purpose of describing particular embodiments only and is not intended to be limiting of the invention. As used herein, the singular forms "a", "an" and "the" are intended to include the plural forms as well, unless the context clearly indicates otherwise. As used herein, a set includes one or more member unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method for detecting and correcting lithographic hot-spots in an integrated circuit (IC) design, the method comprising:
   receiving at a machine learning model (ML model) a layout corresponding to the IC design;
   identifying, at the ML model using a hardware component, a set of input objects corresponding to a target shape in the layout; and
   predicting a retargeting value for the target shape using the set of input objects, such that applying the retargeting value to the target shape in the layout causes the target shape to be modified into a modified target shape, wherein printing the modified target shape instead of the target shape eliminates a lithographic hot-spot that would otherwise occur from printing the target shape in a printed circuit corresponding to the IC design.

2. The method of claim 1, further comprising:
   training the ML model using a collection of training sets, a training set in the collection of training sets including a training layout of a training IC design, a training set of factors corresponding to the training layout, and a training set of retargeting values corresponding to the training set of factors in the training layout.

3. The method of claim 1, wherein identifying the set of input objects comprises:
   performing a shape processing operation on the target shape, the shape processing segmenting an edge of the target shape into a set of edge segments; and
   calculating, for each edge segment in the set of edge segments, an input object in the set of input objects by computing a distance from another shape in a neighborhood of the edge segment in the layout.

4. The method of claim 3, wherein the set of input objects corresponds to the edge segment, wherein the retargeting value modifies the edge segment.

5. The method of claim 4, wherein a new set of input objects is identified for each edge segment in the set of edge segments, and wherein a new retargeting value is predicted for each edge segment using the corresponding new set of input objects.

6. The method of claim 1, wherein the lithographic hot-spot is a lithographic anomaly at a location in the layout where a variation between a printed shape and the target shape exceeds a threshold.

7. The method of claim 1, wherein the set of input object comprises a set of factors associated with the target shape in the layout, wherein the set of factors is determined based on a training set of factors used to train the ML model.

8. The method of claim 1, wherein the ML model is an application, the hardware component is a processor, and the application executes using the processor.

9. The method of claim 1, wherein the ML model is implemented to include the hardware component.

10. The method of claim 1, wherein the ML model includes an artificial intelligence neural network.

11. A computer usable program product comprising a computer usable storage device including computer usable code for detecting and correcting lithographic hot-spots in an integrated circuit (IC) design, the computer usable code comprising:
   computer usable code for receiving at a machine learning model (ML model) a layout corresponding to the IC design;
   computer usable code for identifying, at the ML model using a hardware component, a set of input objects corresponding to a target shape in the layout; and
   computer usable code for predicting a retargeting value for the target shape using the set of input objects, such that applying the retargeting value to the target shape in the layout causes the target shape to be modified into a modified target shape, wherein printing the modified target shape instead of the target shape eliminates a lithographic hot-spot that would otherwise occur from printing the target shape in a printed circuit corresponding to the IC design.

12. The computer usable program product of claim 11, further comprising:
   computer usable code for training the ML model using a collection of training sets, a training set in the collection of training sets including a training layout of a training IC design, a training set of factors corresponding to the training layout, and a training set of retargeting values corresponding to the training set of factors in the training layout.

13. The computer usable program product of claim 11, wherein identifying the set of input objects comprises:
   computer usable code for performing a shape processing operation on the target shape, the shape processing segmenting an edge of the target shape into a set of edge segments; and
   computer usable code for calculating, for each edge segment in the set of edge segments, an input object in the set of input objects by computing a distance from another shape in a neighborhood of the edge segment in the layout.

14. The computer usable program product of claim 13, wherein the set of input objects corresponds to the edge segment, wherein the retargeting value modifies the edge segment.

15. The computer usable program product of claim 14, wherein a new set of input objects is identified for each edge segment in the set of edge segments, and wherein a new retargeting value is predicted for each edge segment using the corresponding new set of input objects.

16. The computer usable program product of claim 11, wherein the lithographic hot-spot is a lithographic anomaly at a location in the layout where a variation between a printed shape and the target shape exceeds a threshold.

17. The computer usable program product of claim 11, wherein the set of input object comprises a set of factors associated with the target shape in the layout, wherein the set of factors is determined based on a training set of factors used to train the ML model.

18. The computer usable program product of claim 11, wherein the computer usable code is stored in a computer readable storage medium in a data processing system, and wherein the computer usable code is transferred over a network from a remote data processing system.

19. The computer usable program product of claim 11, wherein the computer usable code is stored in a computer readable storage medium in a server data processing system, and wherein the computer usable code is downloaded over a network to a remote data processing system for use in a computer readable storage medium associated with the remote data processing system.

20. A data processing system for detecting and correcting lithographic hot-spots in an integrated circuit (IC) design, the data processing system comprising:
   a storage device, wherein the storage device stores computer usable program code; and
   a processor, wherein the processor executes the computer usable program code, and wherein the computer usable program code comprises:

computer usable code for receiving at a machine learning model (ML model) a layout corresponding to the IC design;

computer usable code for identifying, at the ML model using a hardware component, a set of input objects corresponding to a target shape in the layout; and computer usable code for predicting a retargeting value for the target shape using the set of input objects, such that applying the retargeting value to the target shape in the layout causes the target shape to be modified into a modified target shape, wherein printing the modified target shape instead of the target shape eliminates a lithographic hot-spot that would otherwise occur from printing the target shape in a printed circuit corresponding to the IC design.

* * * * *